United States Patent [19]

Koch et al.

[11] Patent Number: 4,717,869
[45] Date of Patent: Jan. 5, 1988

[54] CONTROLLED CURRENT SOURCE APPARATUS FOR SIGNALS OF EITHER POLARITY

[75] Inventors: Rudolf Koch, Unterhaching; Eberhard Schmid, Reutlingen, both of Fed. Rep. of Germany

[73] Assignee: Siemens Aktiengesellschaft, Berlin and Munich, Fed. Rep. of Germany

[21] Appl. No.: 902,487

[22] Filed: Sep. 2, 1986

[30] Foreign Application Priority Data

Sep. 2, 1985 [DE] Fed. Rep. of Germany ....... 3531323

[51] Int. Cl.$^4$ .............................................. G05F 3/26
[52] U.S. Cl. .................................... 323/316; 330/288; 330/260
[58] Field of Search ............... 323/224, 226, 315, 316; 330/257, 288, 260

[56] References Cited

U.S. PATENT DOCUMENTS

| 3,911,353 | 10/1975 | Van De Plassche | 23/315 |
| 4,342,006 | 7/1982 | Ishigaki . | |
| 4,481,481 | 11/1984 | Sleeth et al. . | |
| 4,536,662 | 8/1985 | Fujii | 323/315 |
| 4,573,177 | 2/1986 | Petrosky | 330/257 |
| 4,607,232 | 8/1986 | Gill | 330/257 |

FOREIGN PATENT DOCUMENTS

| 2508801 | 9/1976 | Fed. Rep. of Germany . | |
| 90413 | 5/1984 | Japan | 330/257 |
| 190011 | 9/1985 | Japan | 330/257 |

OTHER PUBLICATIONS

Proceedings of the IEEE, vol. 69, No. 11, Nov. 1981, pp. 1514–1515, IEEE, New York, U.S.: B. Wilson: "A Low-Distortion Bipolar, etc.".
"Operational Amplifiers" G. B. Clayton, Butterworths, England; pp. 154–157.

Primary Examiner—William H. Beha, Jr.
Attorney, Agent, or Firm—Herbert L. Lerner; Laurence A. Greenberg

[57] ABSTRACT

A controlled current source apparatus with a voltage/-current converter for deriving a signal current fed to a load, includes a first current source delivering a first d-c current super-imposed on the signal current, and a second current source connected parallel to the load for delivering a second d-c current substracted from the d-c current leading into the load.

7 Claims, 1 Drawing Figure

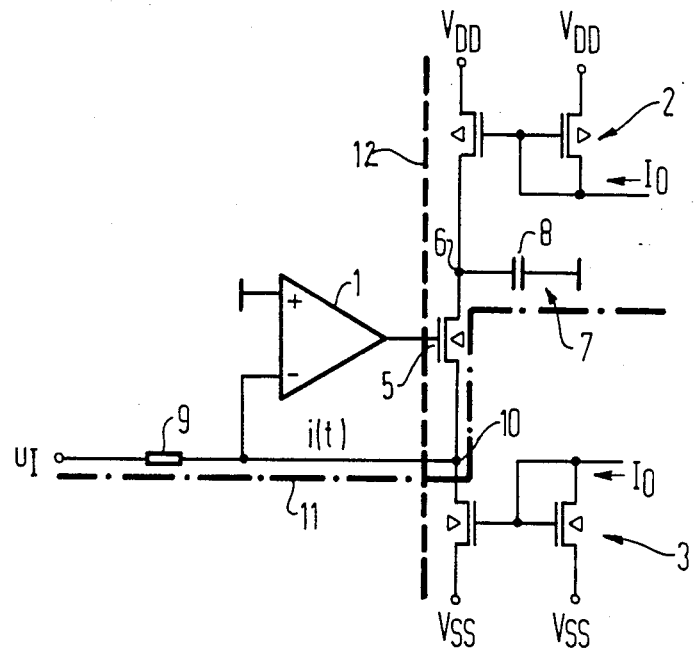

CONTROLLED CURRENT SOURCE APPARATUS FOR SIGNALS OF EITHER POLARITY

The invention relates to a controlled current source apparatus with a voltage/current converter for deriving a signal current fed to a load.

In the publication "Operational Amplifiers", 2nd edition, 1983, FIG. 4.20 by G. B. Clayton, a current source apparatus is disclosed which includes a fed-back operational amplifier. A voltage is applied to the input through the feedback branch. The voltage is derived by a resistor serving as a voltage/current converter which indirectly measures the current fed to the load. The operational amplifier controls the load current through a transistor.

This apparatus has the disadvantage of only permitting positive input voltages to be applied. Furthermore, only one current direction is possible on the output side. Thus, this apparatus is not suitable for the processing of a-c signals.

It is accordingly an object of the invention to provide a controlled current source apparatus, which overcomes the hereinafore-mentioned disadvantages of the heretofore-known devices of this general type, through which output currents with different signs can be generated.

With the foregoing and other objects in view there is provided, in accordance with the invention, a controlled current source apparatus with a voltage/current converter for deriving a signal current fed to a load, comprising a first current source delivering a first d-c current superimposed on the signal current, and a second current source connected parallel to the load for delivering a second d-c current subtracted from the d-c current leading into the load.

The invention is based on the superimposition of a d-c current on the signal current flowing into the load in the control loop and on the subtraction of a d-c current which preferably has the same magnitude, from the current flowing into the load. An advantage of the invention is that due to the use of the current sources, the apparatus is suited very well for construction in an integrated circuit. A further advantage is that integrator circuits can be provided in a simple manner if a capacitive load is present. Such an integrator circuit is distinguished by the fact that it can be used for frequency ranges higher than in the RC and SC integrators known heretofore.

In accordance with another feature of the invention, the first and the second d-c currents are of the same magnitude.

In accordance with a further feature of the invention, the first and the second current sources are in the form of a current reflector device.

In accordance with an added feature of the invention, the first and second current sources are in the form of a cascode.

In accordance with an additional feature of the invention, the first and second current sources are in the form of a Wilson current source.

In accordance with again another feature of the invention, the load is a capacitor device.

In accordance with a concomitant feature of the invention, the converter is a nonlinear current/voltage converter.

Other features which are considered as characteristic for the invention are set forth in the appended claims.

Although the invention is illustrated and described herein as embodied in a controlled current source apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The single FIGURE of the drawing is a schematic circuit diagram of an embodiment of the invention.

Referring now to the FIGURE of the drawing in detail, there is seen a current source apparatus including an operational amplifier 1, a transistor 5 driven by the operational amplifier 1 and first and second current sources 3, 2. At a node 6, the output of the apparatus is connected to a load 7 which is in the form of a capacitor 8 in the illustrated embodiment. The circuit configuration together with a resistor 9 on the input side, represents an integrator. Consequently, a voltage $U_c = (1/R\text{-}C)\int U_I dt$ can be taken off at the capacitor.

A signal current $i(t) = U_I/R$ is generated from an output signal $u_I$ through the fed-back operational amplifier 1. This is accomplished by driving the transistor 5 through the operational amplifier 1 which flows back in a feedback branch through a node 10 to the "−" or inverting input of the operational amplifier 1 and generates a negative feedback signal at the resistor 9. A reference signal is present at the "+" or non-inverting input of the operational amplifier.

A first d-c current $I_O$ from the first current source 3 is added to the signal current $i(t)$ at the node 10, so that the sum of the signal current $i(t)$ and the superimposed first d-c current $I_O$ flows through the transistor 5. A second d-c current $I_O$ is subtracted from the other two currents by the second current source 2 at the node 6. The connection to the load 7 is located at the node 6, so that only the signal current $i(t)$ flows into the load.

The first and second current sources are constructed as conventional current mirror devices, so that they are not described in detail herein.

In order to illustrate the operation of the device, the signal current path is indicated by a dot-dash line 11. The d-c path which lies between two operating potentials $V_{DD}$ and $V_{SS}$ is indicated by a broken line 12. Thus it can be easily seen from the figure that the current composed of the signal current $i(t)$ and the first d-c current $I_O$ is only conducted along a common current path between the node 10 and the node 6.

We claim:

1. Controlled current source apparatus for input signals of either polarity comprising at least two terminals for connection to a power source; an input terminal for receiving an input signal having signal current and signal voltage; a voltage/current converter including a resistor, a transistor and an operational amplifier with negative feedback, connected to the input terminal; an output terminal for supplying an output signal current; a load for receiving the output signal current; a first current source for supplying a first dc-current; a second current source in parallel connection with the load for supplying a second dc-current, means for summing the first dc-current with the input signal current; and means for subtracting the second dc-current from the dc-current flowing into the load.

2. Current source apparatus according to claim 1, wherein the first and the second d-c currents are of the same magnitude.

3. Current source apparatus according to claim 1, wherein said first and the second current sources are in the form of a current mirror device.

4. Current source apparatus according to claim 3, wherein said first and second current sources are in the form of a cascode.

5. Current source apparatus according to claim 3, wherein said first and second current sources are in the form of a Wilson current source.

6. Current source apparatus according to claim 1, wherein the load is a capacitor device.

7. Current source apparatus according to claim 1, wherein the converter is a nonlinear current/voltage converter.

* * * * *